(12) United States Patent
Ikemoto (10) Patent No.: US 9,219,855 B2
(45) Date of Patent: Dec. 22, 2015

(54) IMAGE SENSOR, RANGING APPARATUS, AND IMAGING APPARATUS

(71) Applicant: CANON KABUSHIKI KAISHA, Tokyo (JP)

(72) Inventor: Kiyokatsu Ikemoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/249,532

(22) Filed: Apr. 10, 2014

(65) Prior Publication Data

US 2014/0320733 A1   Oct. 30, 2014

(30) Foreign Application Priority Data

Apr. 27, 2013   (JP) .................................. 2013-094813

(51) Int. Cl.
   *H04N 5/232*   (2006.01)
   *G01S 11/12*   (2006.01)

(52) U.S. Cl.
   CPC ............ *H04N 5/23212* (2013.01); *G01S 11/12* (2013.01)

(58) Field of Classification Search
   CPC ... H04N 5/23212; H04N 5/335; H04N 5/369; H04N 5/3696; H01L 27/14625; G02B 7/34; G02B 7/32; G01S 17/89; G01S 11/12
   See application file for complete search history.

(56) References Cited

U.S. PATENT DOCUMENTS

| | | | | |
|---|---|---|---|---|
| 7,522,801 B2 * | 4/2009 | Makita | .......................... | 385/129 |
| RE44,637 E * | 12/2013 | Li et al. | ........................... | 438/29 |
| 2010/0245656 A1 * | 9/2010 | Fujii et al. | ..................... | 348/345 |
| 2012/0133809 A1 * | 5/2012 | Yamada | ........................ | 348/294 |
| 2013/0277541 A1 | 10/2013 | Ikemoto et al. | | |
| 2014/0071319 A1 | 3/2014 | Ikemoto | | |

FOREIGN PATENT DOCUMENTS

| | | |
|---|---|---|
| JP | 2009-158800 | 7/2009 |
| WO | WO 2012/099262 | * 7/2012 |

* cited by examiner

*Primary Examiner* — Luong T Nguyen
(74) *Attorney, Agent, or Firm* — Fitzpatrick, Cella, Harper & Scinto (57) ABSTRACT

Provided is a ranging apparatus or the like capable of high-accuracy ranging. The image sensor, comprising multiple pixels, wherein the pixels comprises a ranging pixel including a light collecting member, a waveguide, and first and second photoelectric conversion units, wherein: the first and second units are arranged along a first direction; when a region decentered from a center of pupil in a second direction opposite to the first direction is a first pupil region, a region decentered in the first direction is a second pupil region, a region located in the second direction is a first region, and a region located in the first direction is a second region, the collecting member collects lights passed through the first and second pupil regions to the second and first regions; and the waveguide guides lights collected in the second and first regions toward the first and second units.

12 Claims, 8 Drawing Sheets

IMAGE SENSOR, RANGING APPARATUS, AND IMAGING APPARATUS

BACKGROUND OF THE INVENTION

1. Field of the Invention

The present invention relates to an image sensor, and a ranging apparatus and an imaging apparatus including the same.

2. Description of the Related Art

In a digital still camera or a video camera, technologies for detecting distances for automatic focusing (AF) are known. With regard to such technologies for detecting distances for AF, Japanese Patent Application Laid-Open No. 2009-158800 proposes a ranging apparatus in which a part of pixels of an image sensor have a ranging function and the detection is made by a phase difference system. The phase difference system is a method of comparing images of light fluxes that have passed through different regions on a pupil of an imaging optical system, and employing triangulation using stereo images to detect a distance. With this method, unlike the case of a related-art contrast system, it is not necessary to move a lens to measure the distance, and thus high-speed and high-accuracy AF is possible. Further, real-time AF is possible when moving images are taken.

Figure 9A:
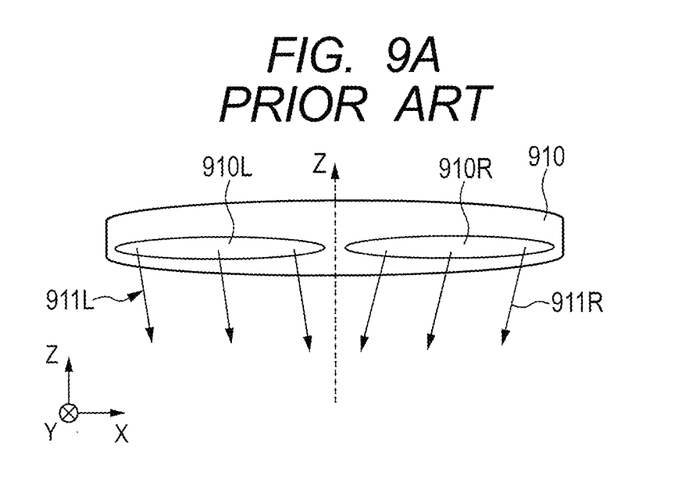
FIG. 9A is a schematic sectional view illustrating a configuration of a ranging pixel of a comparative example.
Figure 9B:
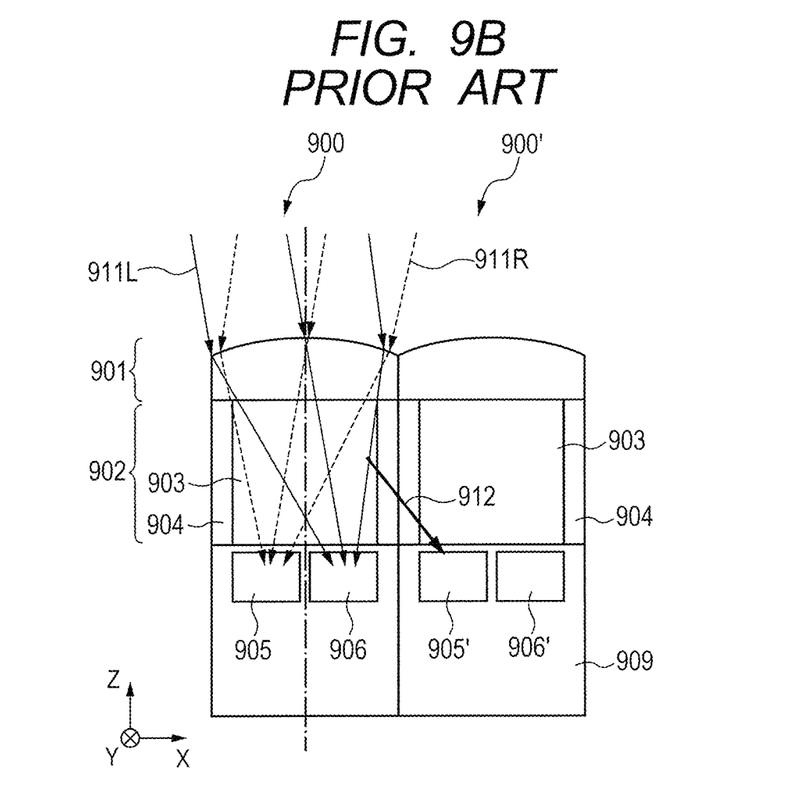
FIG. 9B is a schematic sectional view illustrating a configuration of the ranging pixel of a comparative example.

As a configuration example of a ranging pixel, a configuration illustrated in FIGS. 9A and 9B is known. A ranging pixel 900 includes a microlens 901, a waveguide 902 (including a core 903 and a clad 904), and photoelectric conversion units 905 and 906 provided in a substrate 909. The microlens 901 has focusing positions at positions of the respective photoelectric conversion units 905 and 906. With such a configuration, a light flux 911L that has passed through a partial pupil region 910L on a pupil of an imaging optical system 910 is guided to be received by the photoelectric conversion unit 906, and a light flux 911R that has passed through another pupil region 910R is guided to be received by the photoelectric conversion unit 905. Such a characteristic of the ranging pixel to receive the light flux from a partial region on the pupil is called a pupil division characteristic. Based on signals acquired from those photoelectric conversion units 905 and 906 and known information on the pupil division characteristic, a distance to a ranging target is detected.

However, in FIGS. 9A and 9B, a part of the light flux that passes through the pupil region 910L to be collected by the microlens 901 may not be converted into light in a waveguide mode of the waveguide 902, but may become crosstalk light 912 to propagate through a nearby ranging pixel 900'. A large amount of crosstalk light 912 reaches a particularly closer photoelectric conversion unit 905' of the nearby ranging pixel 900'. The photoelectric conversion unit 905' is originally provided so as to acquire the light flux 911R from the pupil region 910R, and the pupil division characteristic changes when the photoelectric conversion unit 905' also acquires the light flux 911L from the different pupil region 910L. Other photoelectric conversion units may similarly acquire a light flux from a pupil region different from a predetermined pupil region, which cause change in the pupil division performance. In this case, when the diaphragm of the imaging optical system or the ranging target changes, the angular range or wavelength of incident light may change, thereby causing change of the crosstalk light. With this, the pupil division characteristic may be changed from a predetermined characteristic, which may cause deterioration in ranging accuracy.

SUMMARY OF THE INVENTION

The present invention has been made in view of the above-mentioned problems, and has an object to provide a ranging apparatus or the like that is capable of ranging in high accuracy.

According to one embodiment of the present invention, there is provided an image sensor, including multiple pixels, in which at least one of the multiple pixels includes a ranging pixel having a light collecting member, a waveguide having a core and a clad, a first photoelectric conversion unit, and a second photoelectric conversion unit, in which the first photoelectric conversion unit and the second photoelectric conversion unit are arranged in the stated order along a first direction, in which, when a region decentered from a center of a pupil of an imaging optical system in a direction opposite to the first direction is a first pupil region, a region decentered in the same direction as the first direction is a second pupil region, a region located inside the waveguide and located in the direction opposite to the first direction with respect to a center axis of the core is a first region, and a region located inside the waveguide and located in the same direction as the first direction with respect to the center axis of the core is a second region, the light collecting member is configured to collect a light flux that has passed through the first pupil region and a light flux that has passed through the second pupil region to the second region and to the first region, respectively, and in which the waveguide is configured to guide light collected in the second region and light collected in the first region toward the first photoelectric conversion unit and toward the second photoelectric conversion unit, respectively.

Further, according to one embodiment of the present invention, there is provided a ranging apparatus, including the above-described image sensor.

Further, according to one embodiment of the present invention, there is provided an imaging apparatus, including: the above-described image sensor; and an imaging optical system for forming an image of a ranging target on the image sensor.

According to one embodiment of the present invention, the ranging apparatus that is capable of ranging in high accuracy can be achieved.

Further features of the present invention will become apparent from the following description of exemplary embodiments with reference to the attached drawings.

DESCRIPTION OF THE EMBODIMENT

The present invention provides the following configuration in a structure in which first and second photoelectric conversion units of a ranging pixel are arranged in the stated order along a first direction. A light collecting member collects a light flux that has passed through a pupil region that is decentered in a direction opposite to the first direction to a region located in the same direction as the first direction with respect to a center axis of a core of a waveguide, and the waveguide guides the light in this region toward the first photoelectric conversion unit. On the other hand, the light collecting member collects a light flux that has passed through a pupil region that is decentered in the first direction to a region located in the direction opposite to the first direction with respect to the center axis of the core of the waveguide, and the waveguide guides the light in this region toward the second photoelectric conversion unit. With such a configuration, an adverse effect to high-accuracy ranging to be caused by crosstalk light can be suppressed.

A ranging apparatus according to an embodiment of the present invention is described with reference to the drawings. The ranging apparatus may be applied to, for example, imaging apparatus such as a digital still camera, a digital video camera, and a live view camera, and a digital distance measuring device. Further, in the following, description is made with reference to the drawings. In principle, components having like functions are denoted by like reference symbols throughout the drawings, and repetitive description thereof is omitted as much as possible.

First Embodiment

Figure 1A:
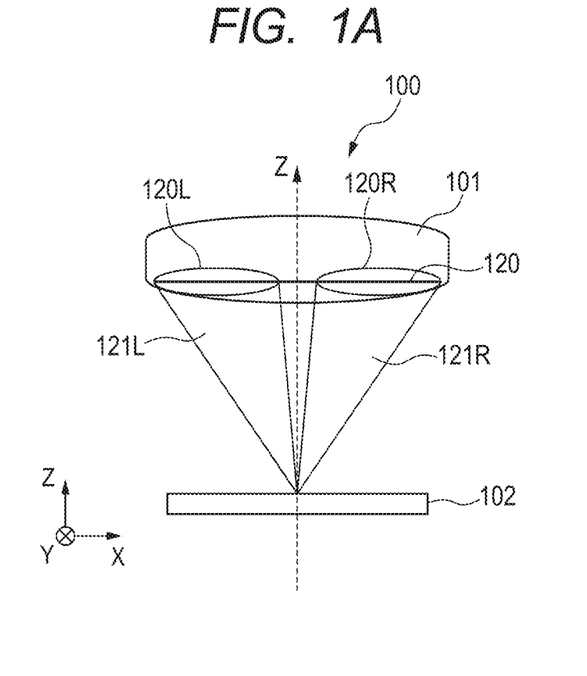
FIG. 1A is a schematic sectional view of an example of an image sensor according to the present invention.
Figure 1B:
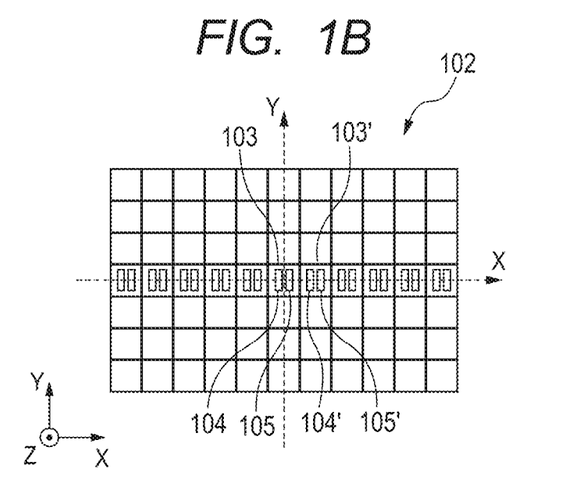
FIG. 1B is a view of an example of an image sensor according to the present invention.

As a first embodiment of the present invention, a configuration example of a ranging apparatus is described with reference to FIGS. 1A, 1B, and 2. In FIG. 1A, a ranging apparatus 100 according to this embodiment includes an imaging optical system 101 and an image sensor 102. The imaging optical system 101 forms an image of a ranging target on the image sensor 102. Further, the ranging apparatus 100 includes a signal processing unit (not shown) for processing signals acquired in the image sensor 102 illustrated in FIG. 1B.

Figure 2:
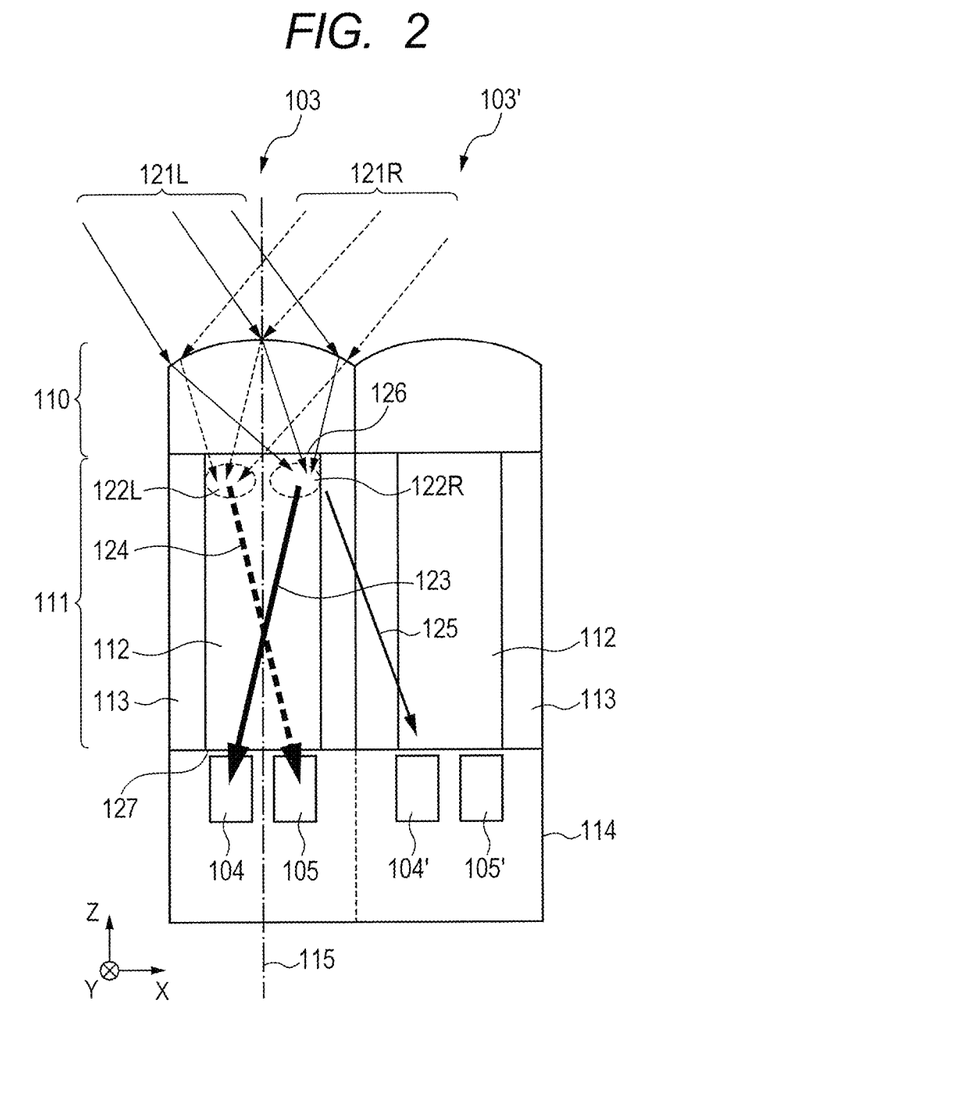
FIG. 2 is a schematic sectional view of an example of a ranging pixel in the image sensor according to the present invention.

A pixel for acquiring information necessary for ranging is called a ranging pixel. The image sensor 102 includes multiple pixels, and a ranging pixel 103 is arranged in at least part of the multiple pixels. The image sensor 102 includes multiple ranging pixels 103 arranged in an x direction. In FIG. 2, the ranging pixel 103 includes a microlens 110 as a light collecting member for collecting incident light arranged on a light incident side (+z side). In this case, a z direction is parallel to an optical axis of the imaging optical system 101 as illustrated in FIG. 1A, but the z direction is not necessarily parallel thereto. Further, the ranging pixel 103 includes a waveguide 111 (core 112 and clad 113), and first and second photoelectric conversion units 104 and 105 provided in partial regions of a substrate 114. The microlens 110 has focusing positions in the core 112 of the waveguide 111. The core 112 and the clad 113 of the waveguide 111 are each made of a material that is transparent in a wavelength band for imaging. For example, the core 112 and the clad 113 are each made of silicon oxide, silicon nitride, an organic material, or the like. The core 112 is made of a material having higher refractive index than that of the clad 113.

The substrate 114 is made of a material that performs absorption in the wavelength band to be detected, which is for example Si. The substrate 114 is subjected to ion implantation or the like to form the photoelectric conversion units 104 and 105 in at least partial regions inside the substrate 114. The photoelectric conversion units 104 and 105 are provided in order along a +x direction corresponding to a first direction (x direction is orthogonal to z direction). The ranging pixel 103 is configured to acquire light fluxes 121L and 121R from pupil regions 120L and 120R, which are decentered in directions opposite to each other along the x direction with respect to a center of a pupil 120 of the imaging optical system 101, by the different photoelectric conversion units 104 and 105. The ranging pixel 103 includes wiring (not shown).

Ranging Principle

As illustrated in FIG. 1A, the imaging optical system 101 forms an image of an outside on the image sensor 102. The distance between the imaging optical system 101 and the image sensor 102 is large with respect to the size of the pixel, and hence light fluxes that have passed through different regions on the exit pupil 120 enter the image sensor 102 as light fluxes having different incident angles. In FIG. 2, when light fluxes enter the ranging pixel 103, the light fluxes are collected by the microlens 110 in different regions of the core 112 of the waveguide 111 in accordance with the incident angles of the light fluxes. The light flux 121L is collected in a region 122R located in the +x direction with respect to a center axis 115 of the core 112, and the light flux 121R is collected in a region 122L located in the −x direction with respect thereto. The collected light fluxes are converted into waveguide modes 123 and 124 of the waveguide 111 to propagate through the waveguide 111. The waveguide mode is expressed as a sum of multiple intrinsic modes of the waveguide, and represents a propagation state through the waveguide. The intrinsic mode is uniquely determined based on the shape and the refractive index of each of the core and clad of the waveguide. The light flux that has entered the waveguide 111 is coupled with the multiple intrinsic modes to propagate through the waveguide in the intrinsic waveguide mode.

The microlens 110 collects light in the regions 122R and 122L of the waveguide. Thus, the light can be converted into a waveguide mode having a decentered electric field distribution to propagate through the waveguide. By appropriately setting the length of the waveguide 111 in the z direction and the position of each of the photoelectric conversion units, light collected in the light collect regions 122R and 122L can be guided to the photoelectric conversion units 104 and 105 located on sides opposite to the light collect regions 122R and 122L along the x direction, respectively. The light fluxes that have reached the photoelectric conversion units 104 and 105 are converted into electrons to output to the signal processing unit (not shown). The images of light fluxes that have passed through different pupil regions are detected by the multiple photoelectric conversion units 104 and 105, and signals for subject ranging are output by a known method to detect the subject distance. In this manner, high-accuracy ranging is possible. By using the characteristic that the waveguide modes inside the waveguide differ, even when the pixel is particularly small, the light fluxes that have passed through different pupil regions can be guided to different photoelectric conversion units, to thereby enable high-accuracy ranging. The ranging is performed as follows, for example. A relative misalignment amount between a subject image signal 1 and a subject image signal 2 corresponding to signals detected by the respective photoelectric conversion units 104 and 105 of each of the multiple ranging pixels 103 becomes an image displacement amount. The image displacement amount can be calculated by a known method, and the image displacement amount can be converted into a defocus amount through a known mathematical expression. Further, based on the focal distance of the imaging optical system 101, the focusing position on the subject side, which is optically conjugate with the image sensor 102, can be calculated. Further, based on the magnification relationship of the imaging optical system 101, the defocus amount on the image side can be converted into the defocus amount on the subject side. The sum of the defocus amount on the subject side and the distance from the imaging optical system 101 to the focusing position on the subject side are calculated to calculate the distance to the subject. As described above, by calculating the defocus amount, the distance to the subject can be calculated.

Reason why Pupil Division Performance Improves

The reason why high-accuracy ranging is possible by the ranging pixel 103 even when the crosstalk light varies depending on the ranging condition is described. In FIG. 2, light that has entered the ranging pixel 103 is collected in the waveguide 111 by the microlens 110, and part of the light is not coupled with the waveguide mode 123 and becomes crosstalk light 125 that propagates through a nearby pixel 103'. The crosstalk light 125 reaches the photoelectric conversion unit of the nearby pixel. Most of the crosstalk light 125 reaches the photoelectric conversion unit 104' that is close to the ranging pixel 103 in which the crosstalk light 125 is generated. The ranging pixel 103' is configured to guide the light flux from the pupil region 120L toward the photoelectric conversion unit 104', and even when the crosstalk light 125 that is a light flux from the same pupil region 120L is received by the photoelectric conversion unit 104', the variation in pupil division characteristic is reduced. The same is true in other photoelectric conversion units, and even when crosstalk light is generated, most of the crosstalk light is received by the photoelectric conversion unit that receives the light flux from the same pupil region as the crosstalk light, and hence the variation in pupil division characteristic is reduced. The multiple photoelectric conversion units 104 and 105 detect the images of light fluxes that have passed through different pupil regions, and signals for subject ranging are output by a known method to detect the subject distance. In this manner, high-accuracy ranging is possible.

Numerical Example

Figure 3A:
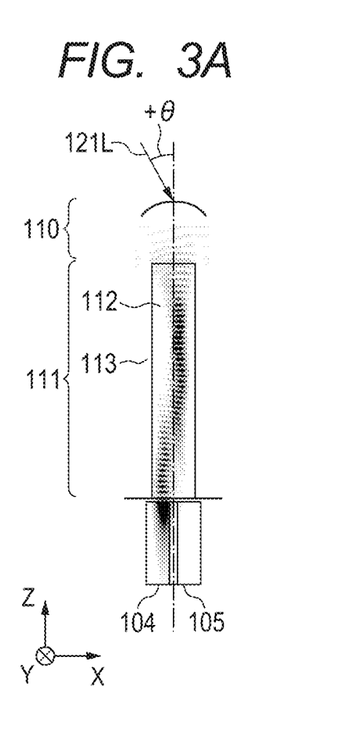
FIG. 3A shows an incident angle dependence of an amount of light detected by the image sensor according to the present invention.
Figure 3B:
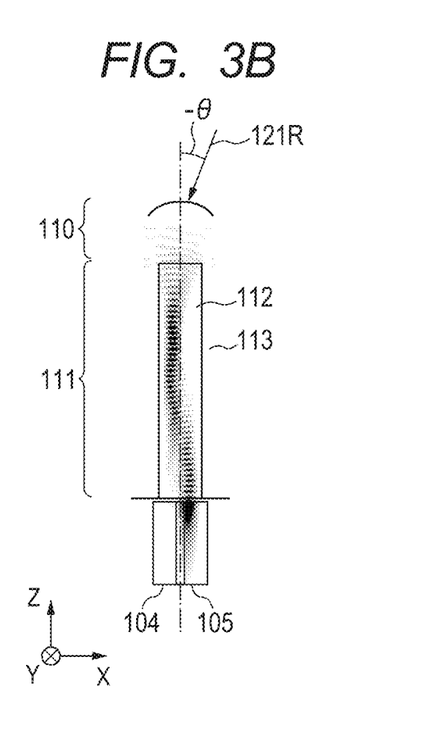
FIG. 3B shows an incident angle dependence of an amount of light detected by the image sensor according to the present invention.
Figure 3C:
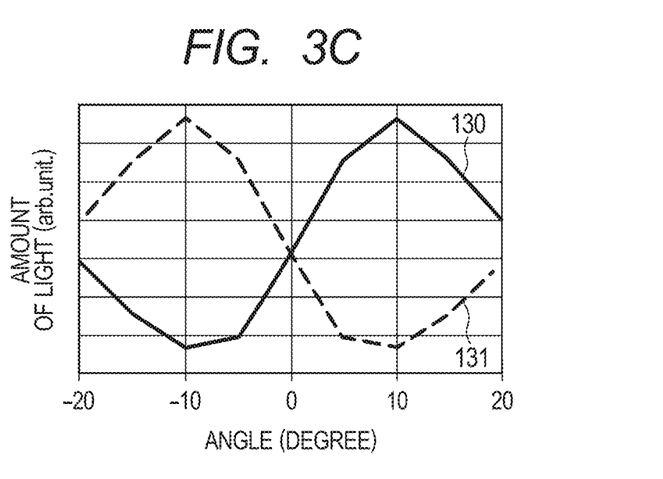
FIG. 3C shows an incident angle dependence of an amount of light detected by the image sensor according to the present invention.

FIGS. 3A and 3B show waveguide modes in the waveguide. FIG. 3A shows an electric field intensity distribution of the light flux 121L from an angle +θ in the ranging pixel, and FIG. 3B shows an electric field intensity distribution of the light flux 121R from an angle −θ in the ranging pixel. The black part in FIGS. 3A and 3B are regions having stronger electric field intensity. As shown in FIGS. 3A and 3B, the incident light fluxes from the pupil regions 120L and 120R are collected by the microlens 110 in regions located in predetermined directions of the waveguide. The collected light couples with waveguide mode light of the waveguide and propagates inside the waveguide to a region located on the opposite side to each light collect region in the first direction to reach the photoelectric conversion unit 104 or 105. FIG. 3C shows the incident angle dependence of light that enters the ranging pixel to exit toward the photoelectric conversion units 104 and 105. The lateral axis represents an incident angle of incident light, and the vertical axis represents an amount of light. A solid line 130 represents the amount of light that exits toward the photoelectric conversion unit 104, and a broken line 131 represents the amount of light that exits toward the photoelectric conversion unit 105. It is understood that, as shown in FIG. 3C, light exits toward different photoelectric conversion units depending on the incident angle. It is understood that, with the configuration of the present invention, the incident light fluxes from different pupil regions (different directions) can be further selectively guided to different photoelectric conversion units.

Figure 4:
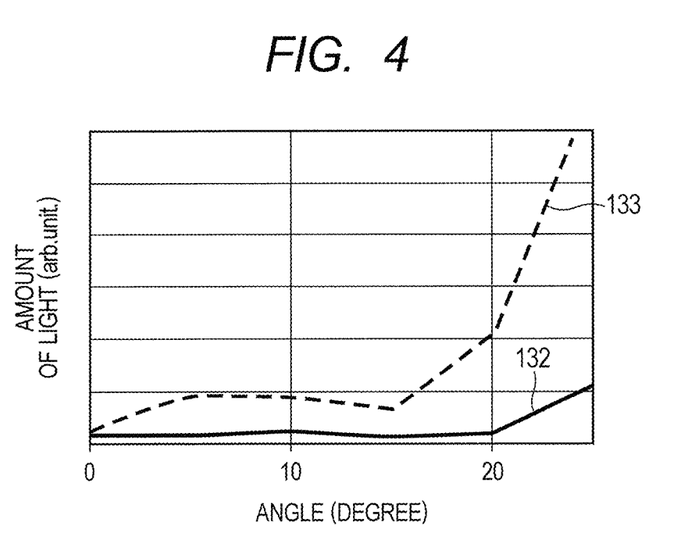
FIG. 4 shows an electric field distribution of a waveguide mode of the image sensor according to the present invention.

FIG. 4 shows the amount of the light flux 121L, which has entered the ranging pixel 103 from the pupil region 120L, propagating as crosstalk light through the ranging pixel 103' acquired by the photoelectric conversion unit 105'. The lateral axis represents an incident angle of incident light, and the vertical axis represents an amount of light that exits toward the photoelectric conversion unit. A solid line 132 represents an example of the configuration of the present invention. A broken line 133 represents the amount of light that exits toward the photoelectric conversion unit 905' in the configuration illustrated in FIGS. 9A and 9B. It is understood that, as shown in FIG. 4, with the configuration of the present invention, the crosstalk light that reaches the photoelectric conversion unit for acquiring the light flux from the pupil region different from the pupil region for the incident light is reduced in the nearby pixel, and the influence of the crosstalk light is reduced.

As described above, in the ranging apparatus of the present invention, at least a part of the pixels of the image sensor is the ranging pixel 103 including the light collecting member 110, the waveguide 111, and the multiple photoelectric conversion units 104 and 105. The first photoelectric conversion unit 104 and the second photoelectric conversion unit 105 are arranged in order in the first direction (+x direction). In this case, a pupil region decentered from the center of the pupil in a direction opposite to the first direction is referred to as the first pupil region 120L, and a region decentered in the same direction as the first direction is referred to as the second pupil region 120R. Further, a region in the waveguide core 112 located in the direction opposite to the first direction with respect to the center axis 115 is referred to as the first region 122L, and a region therein located in the same direction as the first direction with respect thereto is referred to as the second region 122R. The light collecting member 110 is configured to collect the light flux from the first pupil region 120L to the second region 122R, and collect the light flux from the second pupil region 120R to the first region 122L. The waveguide 111 is configured to guide the light in the second region 122R toward the first photoelectric conversion unit 104, and guide the light in the first region 122L toward the second photoelectric conversion unit 105. With such a configuration, even when the ranging condition changes and the crosstalk light varies, the influence on the pupil division performance can be reduced, and high-accuracy ranging is possible.

Light Collecting Position of Light Collecting Member

It is preferred that the ranging pixel of the present invention be configured so that the light collecting member (microlens 110 or the like) collects light to a position separated from a light exit end 127 of the waveguide on a light incident end 126 side as much as possible. It is desired that the light collecting position of the light collecting member be located on the incident end 126 side with respect to a position at the half of the length of the waveguide 111, and more desired that the light collecting position of the light collecting member be located at the position of the incident end 126 of the waveguide. By providing the light collecting position at a position separated from the exit end 127 as much as possible, the length of the waveguide 111 in the propagation direction (z direction) can be reduced, and the image sensor can be more easily formed.

Length of Waveguide

As illustrated in FIG. 2, the light fluxes 121R and 121L that have entered the ranging pixel 103 mainly couple with light in 0th-order, 1st-order, and 2nd-order modes that are intrinsic modes of the waveguide 111, and propagate as the waveguide modes 123 and 124 as interference waves of the intrinsic modes. The incident light mainly couples with 0th-order mode light and 2nd-order mode light, and 1st-order mode light that is asymmetric in the x direction further interferes therewith, and thus the waveguide modes 123 and 124 having a strong electric field in the light collect regions of the waveguide 111 are formed. At this time, a period P in the z direction of the electric field that strongly concentrates in the light collect region becomes a period of about the half of the interference wave of the 0th-order mode light and the 2nd-order mode light, and is represented by the following Expression 1. $P_0$ and $P_2$ represent a period of the 0th-order mode light and a period of the 2nd-order mode light, respectively.

$$P = P_0 P_2 / (P_0 - P_2) \quad \text{(Expression 1)}$$

A period $P_m$ of each mode light can be calculated with use of a general characteristic equation in the waveguide analysis based on the refractive index and shape of a medium constituting the waveguide 111 and the wavelength of light to be waveguided. In the ranging pixel of the present invention, it is desired that the light collecting member (microlens 110 or the like) be configured so that its light collecting position becomes the position at the incident end 126 of the waveguide 111, and the length L of the waveguide 111 in the propagation direction (z direction) is in a range of the following Expression 2. L also refers to a length of the waveguide in a direction perpendicular to a direction in which the multiple pixels are arranged.

$$P_0 P_2 / (P_0 - P_2) \le L \le 2 P_0 P_2 / (P_0 - P_2) \quad \text{(Expression 2)}$$

This reason is described. Light collected by the light collecting member is converted into waveguide mode light whose electric field strongly concentrates in the region in which light is collected at the incident end 126. As the waveguide mode light propagates, the waveguide mode light changes its light collect region in which the electric field strongly concentrates with the period represented by Expression 1 described above. When the length L of the waveguide 111 is set within the range represented by Expression 2 described above, the electric field concentrated in the light collect region at the incident end 126 is propagated inside the waveguide to a region located opposite to the light collect region in the first direction at the light exit end 127 corresponding to the waveguide lower end, and the light can be guided to a region therebelow where the photoelectric conversion unit 104 or 105 is present. With such a configuration, the incident light fluxes from different pupil regions (different directions) can be selectively guided to different photoelectric conversion units.

When the waveguide 111 is approximated to a planar waveguide, by solving a characteristic equation of the following Expression 3, a standardized effective refractive index $b_m$ of each mode can be obtained, and the period $P_m$ can be calculated based on the following Expression 4. Note that, λ represents a wavelength of incident light (detection light), W represents a width of the core 112 in the x direction, $n_0$ and $n_1$ represent a refractive index of the core 112 and a refractive index of the clad 113, respectively, and m represents an order of the mode.

$$\frac{2\pi}{\lambda} W \sqrt{(n_0^2 - n_1^2)(1 - b_m)} - 2 * \tan^{-1}\left(\sqrt{b_m / 1 - b_m}\right) = m\pi \quad \text{(Expression 3)}$$

$$P_m = \frac{\lambda}{\sqrt{b_m(n_0^2 - n_1^2) + n_1^2}} \quad \text{(Expression 4)}$$

In a condition in which the detection light is in a visible wavelength band and 0th-order to 2nd-order waveguide modes are relatively dominant due to a configuration defined by the width W and the refractive index $n_0$ of the waveguide core 112 in a plane in which the pixels are arranged, the following settings are preferred. That is, the length L of the waveguide 111 in the propagation direction (z direction) is desired to be in a range of the following Expression 5 based on Expression 2 to Expression 4. When such a range is taken, in a visible wavelength band, the incident light fluxes from different pupil regions (different directions) can be selectively guided to different photoelectric conversion units.

$$3.35 \times 10^3 \times \frac{W^2}{\sqrt{\lambda / n_0}} \le L \le 4.58 \times 10^3 \times \frac{W^2}{\sqrt{\lambda / n_0}} \quad \text{(Expression 5)}$$

For example, when the wavelength of the detection light is 550 nm, the refractive indexes of the media constituting the core 112 and the clad 113 of the waveguide 111 are 1.8 and 1.5, respectively, and the width of the core 112 is 800 nm, the periods in the 0th-order and 2nd-order modes are 309 nm and 343 nm, respectively. When the length L of the waveguide 111 is set within the range of 3.9 μm to 5.3 μm in accordance with Expression 5, the incident light fluxes from different pupil regions (different directions) can be selectively guided to different photoelectric conversion units.

Scattering Member

Figure 5:
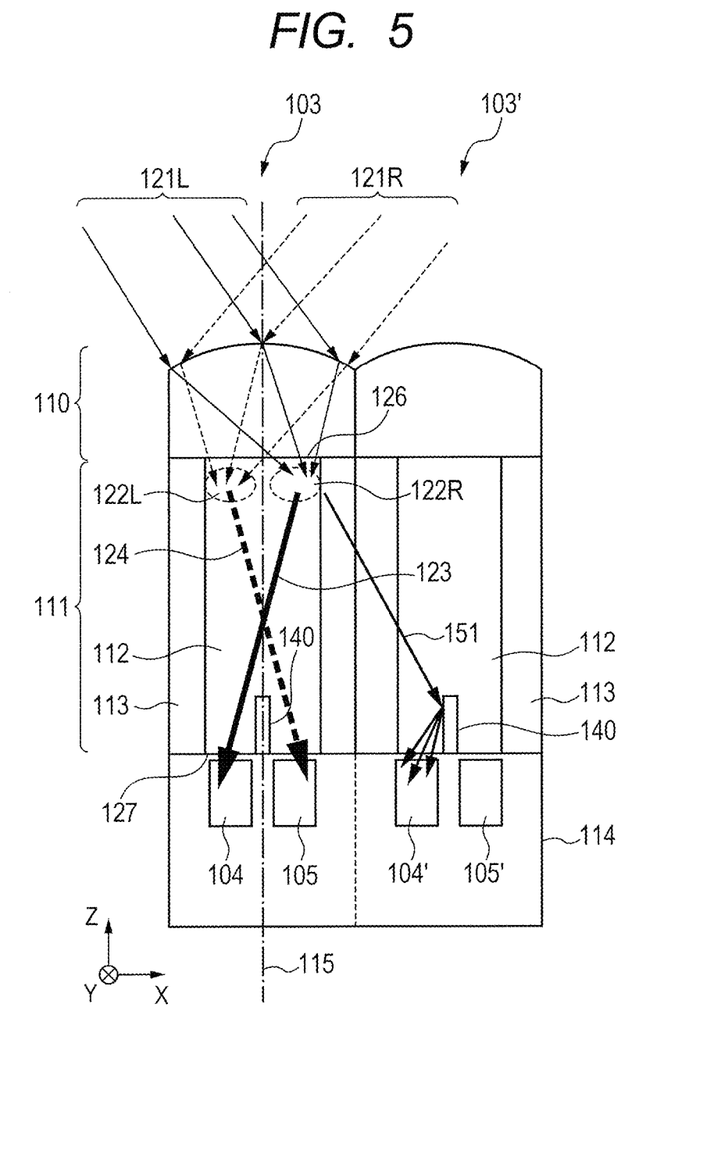
FIG. 5 is a schematic sectional view of another example of the ranging pixel in the image sensor according to the present invention.

In the ranging apparatus of the present invention, as illustrated in FIG. 5, a scattering member 140 may be further formed at the exit end 127 of the waveguide 111 of the ranging pixel 103. The scattering member 140 is formed of a medium having a refractive index lower than that of the core 112, and, for example, formed of the same medium as the clad 113. The scattering member 140 is a member that disturbs part of light that propagates through the waveguide 111. By providing the scattering member 140, light entering the region between the photoelectric conversion unit 104 and the photoelectric conversion unit 105 can be reduced, and light exiting to the regions in which the photoelectric conversion units 104 and 105 are present can be increased. Further, when the scattering member 140 is provided, crosstalk light 151 that propagates from the ranging pixel 103 toward the photoelectric conversion unit 105' that receives the light flux from a different pupil region of the nearby pixel 103' is scattered to be guided more to the other photoelectric conversion unit 104'. In this manner, the influence of the crosstalk light described above can be further reduced.

When the width of the scattering member 140 is too small with respect to the wavelength of light to be detected, the waveguide mode cannot be affected, and when the width thereof is too large, part of light is reflected or scattered to cause light loss. It is desired that the width of the scattering member 140 be about 0.1 time to 2 times for the wavelength of the light to be detected. The width of the region of the core 112 beside the scattering member 140 is desired to have a size that constitutes a multi-mode waveguide in which multiple intrinsic modes are present with respect to the light to be detected by the photoelectric conversion unit. By configuring this region to have many high-order intrinsic modes, the waveguide mode is more easily propagated, and light can be efficiently guided.

Light Collecting Member: Tapered Waveguide

Figure 6A:
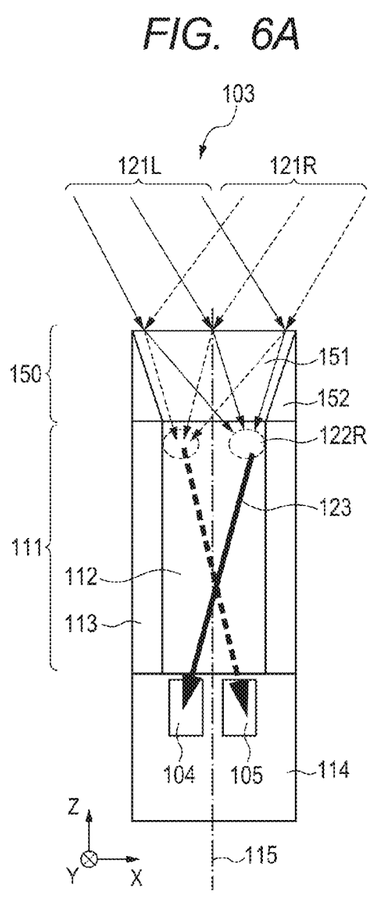
FIG. 6A is a schematic sectional view of another example of the ranging pixel in the image sensor according to the present invention.
Figure 6B:
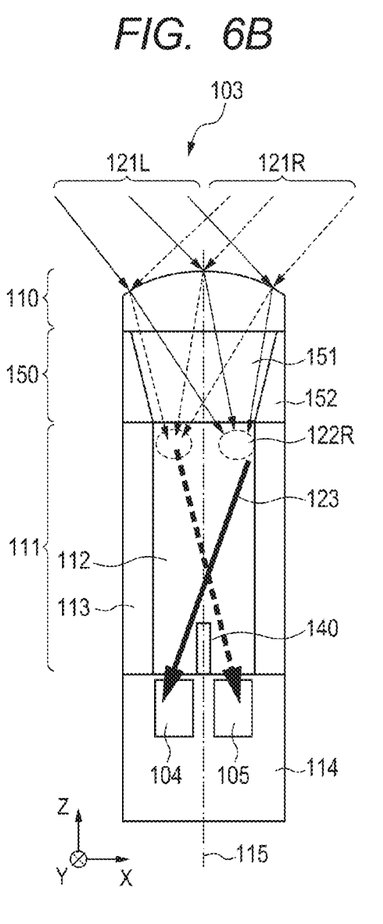
FIG. 6B is a schematic sectional view of another example of the ranging pixel in the image sensor according to the present invention.

In the ranging pixel in the ranging apparatus of the present invention, the light collecting member may be a member other than a microlens. As illustrated in FIG. 6A, the light collecting member may be formed of a waveguide, and may be a waveguide 150 having a taper shape in which an aperture size of a core 151 is reduced from the imaging optical system 101 side toward the waveguide 111 side. The tapered waveguide 150 includes the core 151 and a clad 152, and the core 151 and the clad 152 are made of, for example, the same media as the media constituting the core 112 and the clad 113 of the waveguide 111. The width of the core 151 of the tapered waveguide 150 on the light incident side is the same as the size of the pixel, and the width thereof on the exit side is the same as that of the core 112 of the waveguide 111. Light that has entered such a tapered waveguide 150 couples with the waveguide mode of the tapered waveguide 150 to exit from the exit end. By appropriately setting the shape of the tapered waveguide 150, the light that has entered the entire surface of the pixel can be collected to the light collect region at the exit end of the tapered waveguide 150. Further, the region through which light propagates can be limited to a specific region of the pixel so as to reduce crosstalks generated due to light leakage to the adjacent pixel. Alternatively, as illustrated in FIG. 6B, both of the microlens 110 and the tapered waveguide 150 may be provided as the light collecting member. By appropriately setting the shape and medium of the microlens 110 and the shape and medium of the tapered waveguide 150, incident light can be collected to the waveguide 111 more efficiently to obtain the above-mentioned effect. Further, the above-mentioned scattering member 140 may be provided. Even with such a configuration, effects similar to the above can be obtained.

Color Filter

A color filter may be provided to each pixel. For example, in the configuration of FIG. 2, the color filter can be provided in a region between the microlens 110 and the waveguide 111. With this, a wavelength band of light entering the waveguide can be limited, and the incident light may be easily propagated in a desired waveguide mode. Further, light from different pupil regions can be further selectively guided to different photoelectric conversion units. Alternatively, in the configuration of FIG. 6A, the color filter may be provided on the tapered waveguide 150. Alternatively, in the configurations of FIGS. 6A and 6B, the core 151 of the tapered waveguide 150 may be formed of an absorptive medium so as to obtain both of the function of the color filter and the function of the light collecting member. In this manner, effects similar to the above can be obtained.

Arrangement of Ranging Pixels

Figure 7A:
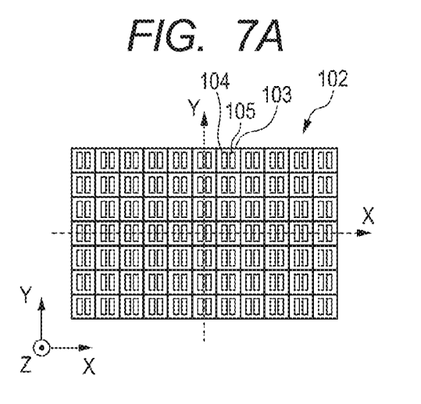
FIG. 7A is a top view of another example of the ranging pixel in the image sensor according to the present invention.

In the configuration of this embodiment, when the ranging pixels 103 are arranged in all of the pixels of the image sensor 102 as illustrated in FIG. 7A, ranging becomes possible in an arbitrary region or the entire region of the image sensor 102. Further, signals acquired by the photoelectric conversion unit 104 and the photoelectric conversion unit 105 included in each pixel may be integrated to be used as an image signal of a taken image.

Figure 7B:
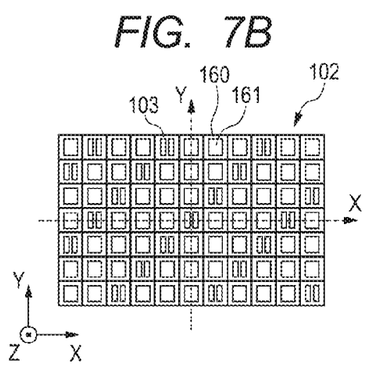
FIG. 7B is a top view of another example of the ranging pixel in the image sensor according to the present invention.

Alternatively, the ranging pixels 103 may be discretely arranged and an imaging pixel 160 may be arranged therebetween as illustrated in FIG. 7B. The imaging pixel 160 is a pixel including a single photoelectric conversion unit 161 inside the pixel. By arranging the ranging pixels separately from each other, the influence of crosstalks can be reduced, and similarly to the above, high-accuracy ranging becomes possible. Note that, when the ranging pixels are separated from each other too much, the resolution of the acquired ranging image is deteriorated to cause reduction in ranging accuracy. It is desired that the ranging pixels be arranged so as to interpose 3 pixels or less therebetween. In the example of FIG. 7B, the ranging pixels 103 are arranged so as to interpose three imaging pixels 160 therebetween in the x direction. An image can be formed by using signals acquired by the imaging pixels 160. With use of the signals acquired by the imaging pixels 160, image signals of nearby ranging pixels may be formed. With such a configuration, the rate of ranging pixels to the image sensor 102 can be reduced, and thus at the same time as ranging, a high-quality image can be taken.

Figure 7C:
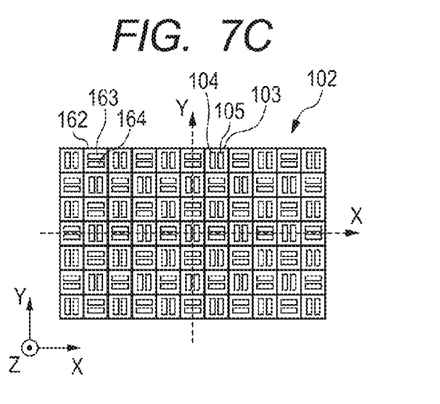
FIG. 7C is a top view of another example of the ranging pixel in the image sensor according to the present invention.
Figure 7D:
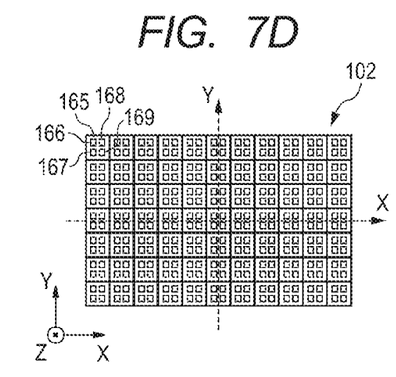
FIG. 7D is a top view of another example of the ranging pixel in the image sensor according to the present invention.

Alternatively, as illustrated in FIG. 7C, ranging pixels 103 and 162 each having a pupil division function may be arranged in the x direction and the y direction, respectively. The ranging pixel 103 includes the photoelectric conversion units 104 and 105 arranged in the x direction, and the ranging pixel 162 includes photoelectric conversion units 163 and 164 arranged in the y direction. Pixel arrays are arranged in each of the x direction and the y direction. The ranging pixel 103 acquires light fluxes from pupil regions different in the x direction of the exit pupil 120, and the ranging pixel 162 acquires light fluxes from pupil regions different in the y direction. With such a configuration, ranging of a subject that has a contrast change can be performed with the ranging pixel 103 in the x direction and with the ranging pixel 162 in the y direction. Alternatively, as illustrated in FIG. 7D, a ranging pixel 165 may include four photoelectric conversion units 166, 167, 168, and 169. The light fluxes from pupil regions different in the x direction and the y direction on the pupil are acquired by the respective photoelectric conversion units. Ranging is possible with use of, in regard to the x direction, signals acquired by the photoelectric conversion units 166 and 167 and signals acquired by the photoelectric conversion units 168 and 169, and with use of, in regard to the y direction, signals acquired by the photoelectric conversion units 166 and 168 and signals acquired by the photoelectric conversion units 167 and 169.

A wiring member for transmitting an electric signal acquired by the photoelectric conversion unit may be provided to the clad part of the waveguide of each pixel. This provides an effect of blocking part of crosstalk light that propagates through the clad of the waveguide, and thus the influence of the crosstalk light can be reduced.

Further, the light collecting member 110 may be provided to the rear surface side (−z side) of the substrate 114, to thereby obtain a rear surface irradiation type configuration in which the waveguide 111 is formed in the substrate 114. With such a configuration, light that has entered the substrate from the rear side (light propagating in the +z direction) is detected. Wiring and the like can be arranged on the front side of the substrate 114 so as to avoid blocking of the propagation of incident light due to the wiring and the like. Further, spatial limitation due to the wiring and the like is alleviated, and hence the waveguide 111 can be more freely shaped. In this manner, incident light can be efficiently guided to the photo-electric conversion unit.

Imaging System

Figure 8:
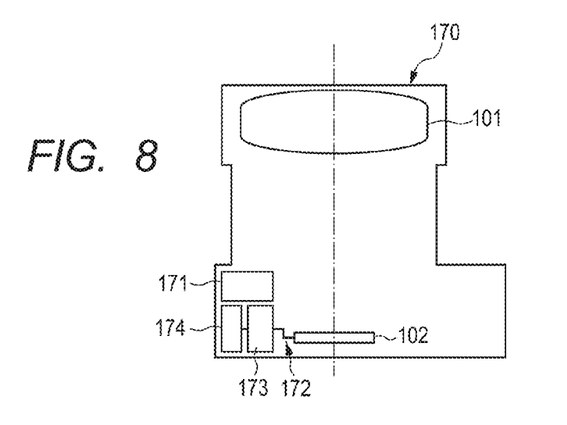
FIG. 8 is a schematic sectional view of an imaging apparatus including the image sensor according to the present invention.

As illustrated in FIG. 8, by providing above-mentioned the ranging apparatus, a CPU 171 for controlling the ranging apparatus, wiring 172 for reading, processing, and recording signals acquired by the image sensor 102, a signal processing board 173, and a recording device 174, an imaging system and an imaging apparatus 170 can be configured. With this configuration, at the same time as ranging, a subject image formed by the imaging optical system 101 can be acquired by the image sensor 102.

Now, an operation example of the imaging apparatus 170 such as a digital camera is described. Note that, the following is only an example. The operation flow after the main power of the imaging apparatus 170 is turned on and a shutter button (not shown) is pressed halfway to be in a so-called half-push state is described. First, information (focal distance, diaphragm value, and the like) of the imaging optical system 101 is read out and stored in the recording device 174. Next, the focus is adjusted. That is, based on the subject image signal output from the image sensor 102, the defocus amount is calculated with use of the ranging procedure. Then, based on the calculated defocus amount, whether or not the imaging optical system 101 is in the focusing state is determined. When the imaging optical system 101 is out of focus, the imaging optical system 101 is driven to a focusing position based on the defocus amount, and then the process returns to the first step. When it is determined that the imaging optical system 101 is in focus, it is determined whether or not a shutter is released (that is, the shutter button is pressed all the way down) by the operation of the shutter button. When it is determined that the shutter is not released, the process returns to the first step and the above-mentioned processing is repeated. When it is determined that the shutter is released, the subject image signal is read out from the image sensor 102 and stored in the recording device 174. The stored subject image signal is subjected to development processing, and thus an observation image can be formed. Further, by applying the ranging procedure to the stored subject image signal, a subject distance image (subject distance distribution) that corresponds to the observation image can be formed.

As described above, the light collecting member, the waveguide, and the multiple photoelectric conversion units are provided in the pixel, and the shape, medium, and arrangement of the light collecting member and the waveguide are appropriately set. In this manner, light can be separated in accordance with an incident angle. Even when the crosstalk light varies depending on the ranging condition, a high-accuracy ranging signal can be acquired, and hence the ranging apparatus that can measure a distance with high accuracy can be achieved.

Considering application of the present invention to a digital camera or the like, the present invention may be regarded as a ranging apparatus that is used for a single-lens reflex camera or the like to perform dedicatedly the ranging separately from an imaging part for taking a subject image, or may be regarded as an apparatus suitable for so-called imaging surface ranging that also performs the ranging with use of the imaging part. As described above, with use of the distance detected by the present invention, a distance distribution (distance map) that corresponds to an image obtained by the imaging apparatus can be formed. Further, the amount of blur of the subject in the image depends on the defocus amount, and hence by performing processing based on the distance distribution with respect to the obtained image, image processing such as arbitrary blur adding processing, refocus processing (processing of focusing at an arbitrary position) after imaging and the like can be appropriately performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-094813, filed Apr. 27, 2013, which is hereby incorporated by reference herein in its entirety.

What is claimed is:

1. An image sensor, comprising multiple pixels, the multiple pixels including at least one pixel in which a light collecting member, a waveguide including a core and a clad, a first photoelectric conversion unit, and a second photoelectric conversion unit are disposed, wherein the first photoelectric conversion unit and the second photoelectric conversion unit are arranged in order along a first direction in the one pixel, a region decentered from a center of a pupil of an imaging optical system in a direction opposite to the first direction is referred to as a first pupil region, a region decentered in the first direction is referred to as a second pupil region, a region located inside the waveguide and located in the direction opposite to the first direction with respect to a center axis of the core is referred to as a first region, and a region located inside the waveguide and located in the first direction with respect to the center axis of the core is referred to as a second region, the light collecting member is configured to collect a light flux that has passed through the first pupil region and a light flux that has passed through the second pupil region to the second region and to the first region, respectively, and the waveguide is configured to guide light collected in the second region and light collected in the first region toward the first photoelectric conversion unit and toward the second photoelectric conversion unit disposed in the one pixel, in which the waveguide is mounted, respectively.

2. The image sensor according to claim 1, wherein the light collecting member comprises a lens.

3. The image sensor according to claim 1, wherein the light collecting member comprises a tapered waveguide having a taper shape in which an aperture size reduces from an imaging optical system side toward a waveguide side.

4. The image sensor according to claim 1, wherein the light collecting member comprises a lens; and
a tapered waveguide having a taper shape in which an aperture size reduces from an imaging optical system side toward a waveguide side.

5. The image sensor according to claim 1, wherein the first region and the second region are each located on an incident end side of the waveguide with respect to a position at a half of a length of the waveguide in a direction perpendicular to a direction in which the multiple pixels are arranged.

6. The image sensor according to claim 1, wherein a length L of the waveguide in a direction perpendicular to a direction in which the multiple pixels are arranged satisfies the following expression:

$$P_0 P_2/(P_0-P_2) \leq L \leq 2 P_0 P_2/(P_0-P_2)$$

where $P_0$ and $P_2$ represent a period in a 0th-order mode and a period in a 2nd-order mode, respectively, of the waveguide with respect to a wavelength of light to be detected by the first photoelectric conversion unit and the second photoelectric conversion unit.

7. The image sensor according to claim 1, wherein a length L of the waveguide in a direction perpendicular to a direction in which the multiple pixels are arranged satisfies the following expression:

$$3.35 \times 10^3 \times \frac{W^2}{\sqrt{\lambda/n_0}} \leq L \leq 4.58 \times 10^3 \times \frac{W^2}{\sqrt{\lambda/n_0}}$$

where $\lambda$ represents a wavelength of light to be detected by the first photoelectric conversion unit and the second photoelectric conversion unit, W represents a width of the core in a plane in which the multiple pixels are arranged, and $n_0$ represents a refractive index of the core.

8. The image sensor according to claim 1, further comprising a scattering member on an exit end side of the waveguide.

9. The image sensor according to claim 1, wherein the image sensor comprises multiple first pixels and multiple second pixels including a single photoelectric conversion unit, the first pixels being said at least one pixel, and the multiple first pixels are arranged so as to interpose three or less of the multiple second pixels therebetween.

10. The image sensor according to claim 1, further comprising a color filter between the light collecting member and the waveguide.

11. A ranging apparatus, comprising the image sensor according to claim 1.

12. An imaging apparatus, comprising:
the image sensor according to claim 1; and
an imaging optical system for forming an image of a ranging target on the image sensor.

* * * * *